United States Patent
Perner et al.

(10) Patent No.: US 9,558,820 B2
(45) Date of Patent: Jan. 31, 2017

(54) RESISTIVE CROSSPOINT MEMORY ARRAY SENSING

(71) Applicant: Hewlett Packard Enterprise Development LP, Houston, TX (US)

(72) Inventors: Frederick Perner, Palo Alto, CA (US); Yoocharn Jeon, Palo Alto, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 15/031,106

(22) PCT Filed: Oct. 29, 2013

(86) PCT No.: PCT/US2013/067268
§ 371 (c)(1),
(2) Date: Apr. 21, 2016

(87) PCT Pub. No.: WO2015/065337
PCT Pub. Date: May 7, 2015

(65) Prior Publication Data
US 2016/0267970 A1    Sep. 15, 2016

(51) Int. Cl.
*G11C 13/00*    (2006.01)
(52) U.S. Cl.
CPC .......... *G11C 13/004* (2013.01); *G11C 13/003* (2013.01); *G11C 13/0069* (2013.01); *G11C 2213/15* (2013.01); *G11C 2213/72* (2013.01); *G11C 2213/73* (2013.01)
(58) Field of Classification Search
CPC .................................................. G11C 2213/73

USPC ............................................................ 365/148
See application file for complete search history.

(56) References Cited

U.S. PATENT DOCUMENTS

| | | | |
|---|---|---|---|
| 5,844,834 A | 12/1998 | Risch et al. | |
| 6,838,720 B2* | 1/2005 | Krieger ............. | G11C 13/0016 257/288 |
| 6,914,255 B2* | 7/2005 | Lowrey ............. | G11C 13/0004 257/2 |
| 8,358,532 B2 | 1/2013 | Pellizzer et al. | |
| 8,565,004 B2* | 10/2013 | Iijima ................ | G11C 11/5685 365/148 |
| 2004/0004867 A1 | 1/2004 | Scinabel et al. | |
| 2007/0008786 A1 | 1/2007 | Scheuerlein | |

(Continued)

FOREIGN PATENT DOCUMENTS

WO    WO-2006078506 A2    7/2006

OTHER PUBLICATIONS

Huang, J-J. et al., Bipolar Nonlinear Ni/TiO2/Ni Selector for 1S1R Crossbar Array Applications, Oct. 2011, vol. 32, No. 10, 3 Pages.

(Continued)

*Primary Examiner* — Son Mai
(74) *Attorney, Agent, or Firm* — Fabian VanCott

(57) ABSTRACT

A method includes applying a voltage bump across a combined memory device comprising a volatile selector switch and a nonvolatile switch, in which the voltage bump changes a state of the volatile selector switch from a high resistance to a low resistance but does not change a state of the nonvolatile switch. A read voltage that is lower than the voltage bump across the combined memory device to read a state of the nonvolatile switch.

15 Claims, 7 Drawing Sheets

(56) References Cited

U.S. PATENT DOCUMENTS

| | | | |
|---|---|---|---|
| 2011/0317470 A1* | 12/2011 | Lu ..................... | G11C 13/0007 365/148 |
| 2013/0088911 A1 | 4/2013 | Nakura et al. | |
| 2013/0210193 A1 | 8/2013 | Lee et al. | |
| 2013/0214236 A1 | 8/2013 | Lu et al. | |
| 2013/0314975 A1* | 11/2013 | Katayama .......... | G11C 13/0069 365/148 |

OTHER PUBLICATIONS

International Searching Authority, The International Search Report and the Written Opinion, Jul. 16, 2014, 12 Pages.

Lo, C-L. et al., Dependence of Read Margin on Pull-Up Schemes in High-Density One Selector-One Resistor Crossbar Array, Jan. 2013, vol. 60, No. 1, 7 Pages.

* cited by examiner

| Switch | State | Region | Switching Voltage | Resistance |
|---|---|---|---|---|
| Volatile Switch | OFF | Region 1 | -0.4 < V < 0.4 | 10 MΩ |
| | ON | Regions 2, 3, 4, 5 | V < -0.4<br>V > 0.4 | 10 kΩ |
| | ON | All regions until current is interupted | $V_{bump}$ = 0.6 | 10 kΩ |
| Memristor (Nonvolatile Switch) | OFF | After application of +Vw any of regions 1, 2, 4, 5 | $+V_w$ = 0.5 | 1 MΩ |
| | ON | After application of -Vw any of regions 1, 2, 3, 4 | $-V_w$ = -0.7 | 100 kΩ |
| | Stable | | $V_{bump}$ = ±0.6 | |

RESISTIVE CROSSPOINT MEMORY ARRAY SENSING

BACKGROUND

Most memories in electronic devices have transistors that connect and disconnect memory elements from the reading/writing circuits. These transistors have very high ON/OFF ratios and prevent leakage currents from passing through devices that are not selected for reading or writing. Since the transistors with the required characteristics can be fabricated only by using a semiconductor with few defects, they are fabricated on single crystalline silicon wafers. This can severely limit the design flexibility and available materials in creating memories. For example, it can be very challenging to design and fabricate high density multilayer memory using single crystalline silicon wafers.

Further, the inclusion of a transistor in the memory array decreases the density of the memory. To increase the integration density of memory devices that include transistors, the transistor needs to become smaller and smaller. However, as the transistor size decreases, it becomes increasingly difficult to satisfy the performance requirements and the fabrication costs increase prohibitively.

BRIEF DESCRIPTION OF THE DRAWINGS

The accompanying drawings illustrate various examples of the principles described herein and are a part of the specification. The illustrated examples are merely examples and do not limit the scope of the claims.

Throughout the drawings, identical reference numbers designate similar, but not necessarily identical, elements.

DETAILED DESCRIPTION

Figure 1:
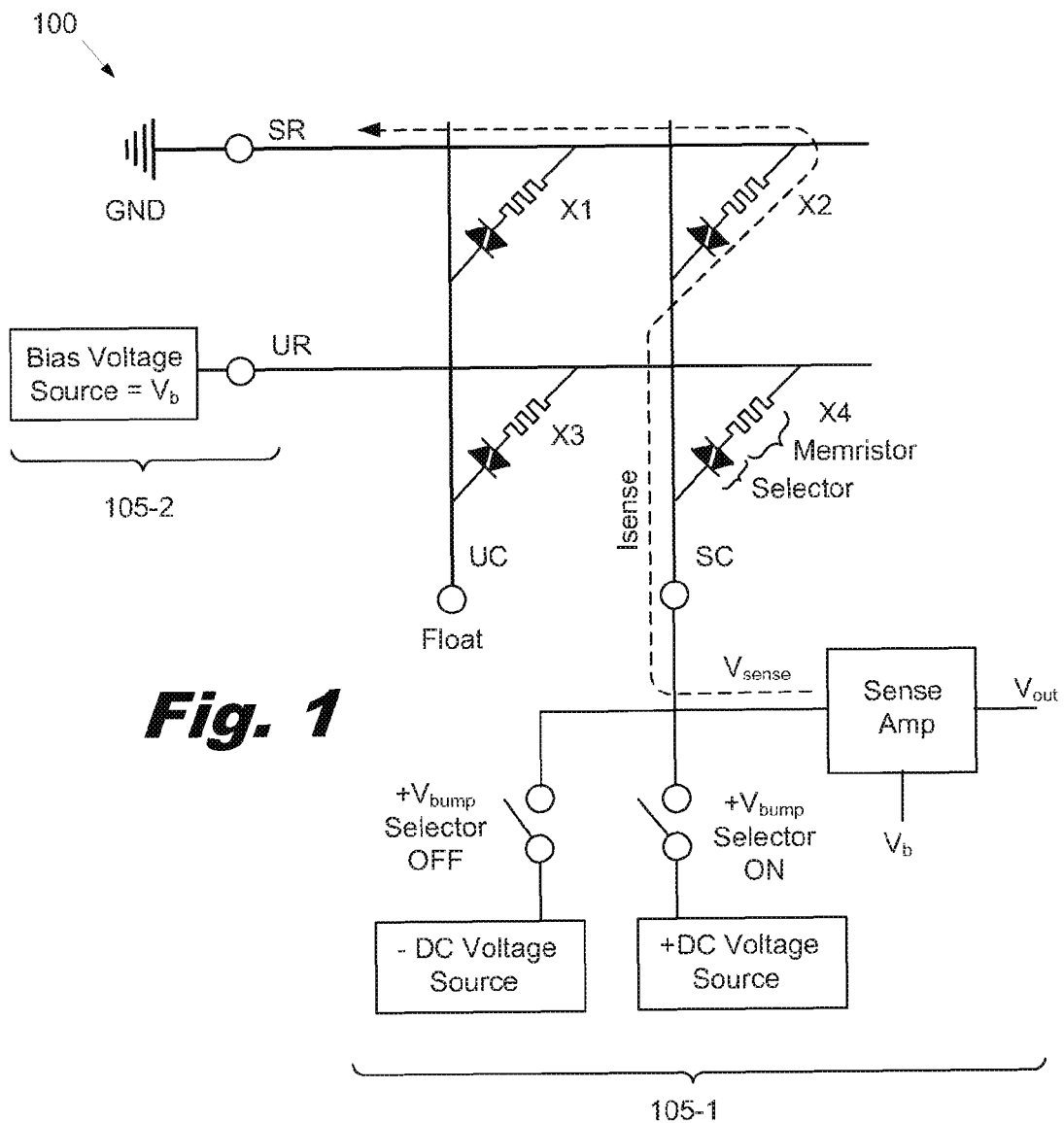
FIG. 1 is a simplified circuit diagram of a resistive crosspoint memory array, according to one example of principles described herein.

The principles below describe resistive memory devices and resistive crosspoint memory arrays that do not include transistors as switching elements to access the individual memory devices. Resistive memory arrays can be formed by resistive memory devices that are sandwiched between crossing conductors. For example, row lines can be formed in a first metal layer and column lines can be formed in a second overlying metal layer. The resistive memory devices are sandwiched between the two metal layers at each crossing point between a row line and a column line. To read or write to a particular resistive memory device, the row line and column line that intersect at the resistive memory device are selected. When a write voltage is applied to the selected row and column, the selected memory device is programmed to a desired resistance ("state"). The state of the resistive memory device remains stable over a desired time period and forms nonvolatile memory. The state of the resistive memory device can be read multiple times without altering its state. To read a state of the resistive memory device, a read voltage is applied across the associated row and column line for the element. The amount of current flowing through the resistive memory device is proportional to the resistance (state) of the memory device. Measuring this current allows the state of the memory device to be determined. The memory density (bits/cm$^2$) of these resistive crosspoint arrays can be very high.

However, because the resistive memory arrays lack switching transistors for each memory device, there can be leakage currents that pass through non-selected memory devices. For example, memory devices that are connected to one of the selected row lines or column lines, but not to both, are called half selected memory devices. These half selected memory devices can be exposed to some portion of the read or write voltage but not the full read or write voltage. Current passing through these half selected memory devices are called "leakage currents." The leakage currents represent undesirable noise that can obscure the current passing through the selected device. This can make it more difficult to discern the state of the selected device. Additionally, the leakage currents may cause voltage fluctuations across the array or other transient disturbances. This can result in a number of negative outcomes, such as operating the memory array at a lower frequency to minimize these transient effects. Additionally, larger supply circuitry may be needed to source the higher current passing through the array. These adaptations result in a larger, less dense memory array and/or degrade the operation of the memory array.

The leakage currents can be minimized in a variety of ways including applying various bias voltages to the non-selected row and column lines to minimize voltage differences across the non-selected and half selected devices. Additionally or alternatively, a current controlled volatile selector switch may be included in series with the memristor-like resistive nonvolatile switch to form a combined memory device (a "1S1R memory device"). The volatile selector switch has a high resistance at low voltages/currents. This effectively disconnects the memory device from the read circuitry and minimizes leakage currents. When the current exceeds the threshold current (i.e. due to a voltage applied across a selected memory device), the resistance of the volatile selector switch changes to a low resistance state. This allows most of the read or write voltage to be applied across the nonvolatile switch in the selected memory device. The state of the nonvolatile switch can then be read or altered. For this family of memory devices, the properties of the volatile selector switch and nonvolatile switch can be independently engineered to meet a range of design requirements. In many cases, the properties of the volatile selector switch can be changed without requiring changes to the nonvolatile switch design.

As discussed above, the volatile selector switch has a very high resistance at low voltages and then quickly switches to a very low resistance state after a threshold voltage is exceeded. This switching threshold voltage is greater than any half select voltage, but may be less that read or write voltages. Consequently, when a read or write voltage is applied across a selected 1S1R memory device, the volatile selector switch rapidly switches to its low resistance state. The state of the non-volatile memory device can then be read or written. However, the volatile selector switches in the half selected device remain in their very high resistance state. This significantly reduces the leakage currents in the array. In some designs the leakage currents become so small that they can be neglected as a design consideration or a noise source.

Using combined memory devices works well for write voltages, which are significantly higher than read voltages. The application of a write voltage allows for repeatable and rapid switching of the volatile selector switch in the combined memory devices. The read voltage must be higher than the voltage switching threshold for the volatile selector switch to allow the volatile selector switch to switch to its low resistance state so that the resistance of the nonvolatile switch can be read (a READ margin issue). The read voltage must be lower than the writing threshold voltage for the nonvolatile switch so that the state of the nonvolatile switch is not changed by the read voltage (a READ disturb issue). Thus, the read voltage is constrained to be between the switching threshold voltage of the volatile selector switch and the switching threshold voltage of the nonvolatile switch. In theory, this window exists and contains a range of acceptable read voltages. However, in practice, there are variations between the thousands or millions of combined memory devices in a resistive crosspoint memory array. These variations can result from material and geometric differences between the various combined memory devices in the array. For example, nonvolatile switches on one side of the array may be slightly thinner than nonvolatile switches on the other side of the array. The thinner nonvolatile switches may have a lower writing threshold voltage than the thicker nonvolatile switches. Further, there may be material variations in the material that makes up the volatile selector switches that result in a lower or higher switching threshold in various parts of the array. These variations shrink the acceptable window of read voltages until it can be impractical to use a single read voltage to read the state of all the combined memory devices in the array.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples.

The principles below describe the characteristics of these combined memory devices, interaction between the volatile selector switch and nonvolatile switch in the combined memory devices, parameters for adjusting the performance of the combined memory devices, their integration into memory arrays, and the operation of these memory arrays. Specifically, these principles are directed to systems and methods to activate the selected combined memory device to eliminate the READ disturb and READ margin issues and allow the READ schemes to independently optimize the READ bias voltages.

FIG. 1 shows one example of a resistive crosspoint memory array (100) and its supporting circuitry (105). The resistive crosspoint memory array (100) includes a number of rows (SR, UR) that are electrical conductors represented by horizontal lines in the circuit diagram. A number of columns (UC, SC) are electrical conductors that cross over each of the rows. The rows and columns do not intersect each other, but cross over each other with a vertical space in between. Combined memory devices (X1, X2, X3, X4) are connected between rows and columns at the crossing points.

The combined memory devices in this example include a nonvolatile switch (shown as a memristor symbol) and a volatile selector switch (shown as a DIAC symbol labeled "selector"). A DIAC is a "Diode for Alternating Current" that conducts current only after its breakover voltage is exceeded. The volatile selector switch is not literally a DIAC, but the DIAC symbol is used to graphically represent the functionality of the volatile selector switch. In some examples the nonvolatile switches may be memristors, resistive random access memory (ReRAM), conductive-bridging random access memory (CBRAM), phase change memory (PRAM, PCRAM), and other types of memory. For example, the crosspoint devices could be resistive memory based on perovskites (such as $Sr(Zr)TiO_3$ or PCMO), transition metal oxides (such as $Ta_2O_5$, NiO or $TiO_2$), chalcogenides (such as $Ge_2Sb_2Te_5$ or AgInSbTe), solid-state electrolyte materials (such as GeS, GeSe, or $Cu_2S$), organic charge transfer complexes (such as CuTCNQ), organic donor—acceptor systems (such as Al AlDCN), and various other material and molecular systems.

Though a DIAC shows good volatile switching behavior, the fabrication may use a high temperature process, which may not be compatible with integration of high-density memories in a passive cross-bar array. In one example, a volatile selector can be made without such a high temperature process using a thin film of $NbO_2$, $VO_2$ or phase changing chalcogenides sandwiched by two metallic conductors. These materials have a very non-linear conductivity dependence on the temperature. The heat generated by the current that flows through the selector makes the device more conductive, which further increases the current. This positive feedback results in an abrupt conductivity increase and the high conductivity is maintained until the current is lowered below a certain threshold value.

The size of the crosspoint memory array may vary. In this example, only 4 crosspoints are illustrated for clarity. However, a crosspoint memory array may include hundreds of row and column lines and thousands or millions of combined memory devices. For example, a crosspoint memory array may include 1024 rows, 1024 columns, and 1048576 combined memory devices. The crosspoint memory array may be tiled with other crosspoint memory devices to form devices with much greater capacity. The specific details given herein are only examples. The crosspoint memory array may have a variety of different sizes and architectures.

The support circuitry (105-1, 105-2) includes a sense amp, DC voltage sources, voltage bump selector switches, a bias voltage source, and a ground. The support circuitry may include a number of additional components, such as addressing circuitry. The operation of the sense circuitry to read and write to combined memory devices in the memory array are described in more detail below.

Figure 2A:
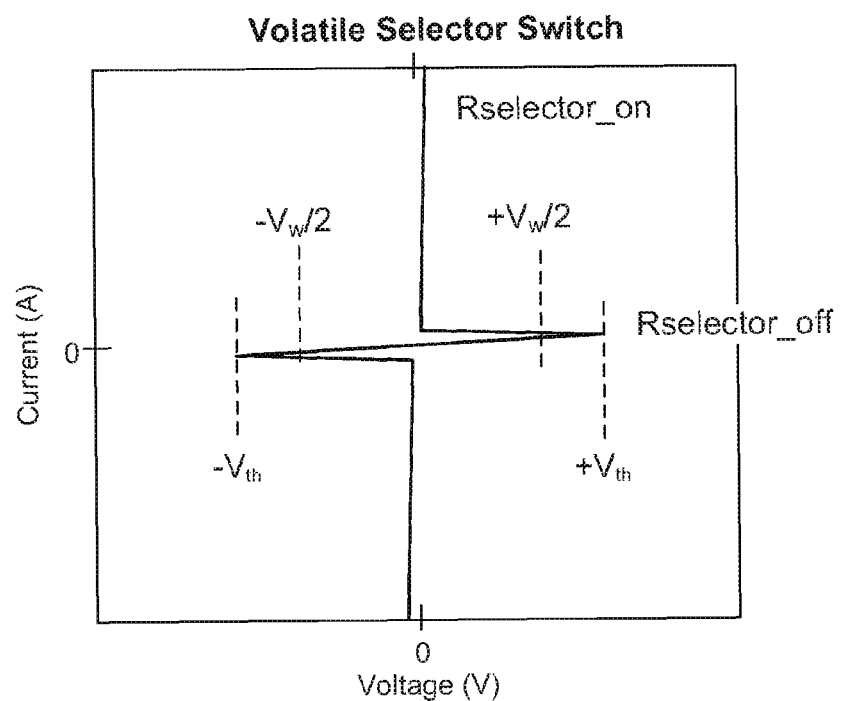
FIGS. 2A and 2B are graphs of current/voltage behavior of a volatile selector switch and a nonvolatile switch in a combined memory device, according to one example of principles described herein.

FIG. 2A is a graph that shows the current/voltage behavior of a volatile selector switch (a "selector"). The graph in FIG. 2A shows voltage on the horizontal axis and current on the vertical axis, with the zero points in the center of the graph. In this example, the volatile selector switch is a two terminal "negative resistance device (NRD)" that at zero bias functions as a high impedance resistor (Rselector_off). The volatile selector switch will remain in a high impedance state until the voltage applied across the selector switch is increased to a switch threshold voltage ($\pm V_{th}$). This is illustrated as a slightly angled horizontal line in the trace labeled Rselector_off. This clearly illustrates that the minimal current flows through the volatile selector switch over a wide range of voltages between a negative threshold voltage ($-V_{th}$) and a positive threshold voltage ($+V_{th}$). These threshold voltages are significantly greater than a half of the write voltages ($-V_w/2$, $+V_w/2$) of the nonvolatile resistive switch. These write voltages are described below with respect to FIG. 2B.

At the negative or positive threshold voltages, the behavior of the volatile selector switch abruptly changes to the low resistance ON state. In this state, the resistance of the volatile selector switch is indicated by a nearly vertical line labeled Rselector_on. This vertical line shows that for minimal voltages, a relatively large amount of current flows through the selector device in its ON state. The volatile selector switch remains in the low resistance until the current flowing in the volatile selector switch is reduced to a low value. The volatile selector switch will then switch back to its high impedance OFF state (Rselector_off). For example, in OFF resistance may be 10 MΩ and the ON resistance may be 10 kΩ. When the selector switch is OFF it effectively isolates the nonvolatile memory switch and disconnects the row line from the column line at that combined memory device. When the selector switch is in the ON state, its low resistance allows for the majority of the voltage drop to occur across the nonvolatile switch. This allows the state of the nonvolatile switch to be measured. The selector switch is assumed to be bidirectional, i.e., has similar I-V characteristics for both positive and negative voltages and currents.

Figure 2B:
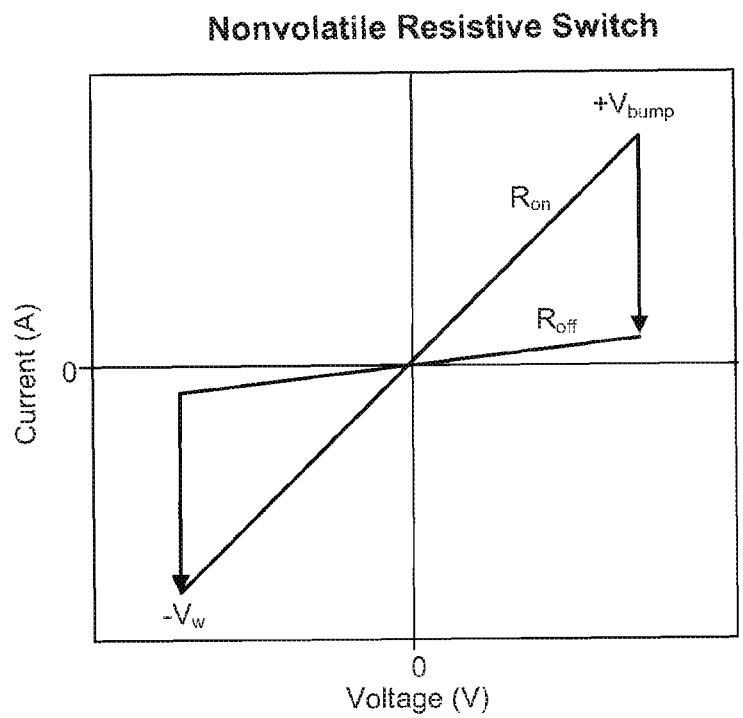

FIG. 2B is a graph of the current/voltage behavior of a nonvolatile resistive switch. The more horizontal line on the graph (labeled "$R_{off}$") represents the high resistance state of the nonvolatile resistive switch. For example, the high resistance state of the nonvolatile resistive switch may be 1 MΩ. The low resistance state of the nonvolatile resistive switch is shown as the angled line labeled "$R_{on}$". In one implementation, the resistance of the nonvolatile resistive switch in its on state may be 100 kΩ. The nonvolatile switch changes state when a write voltage ($\pm V_w$) is applied. In this example, when a positive write voltage ($+V_w$) is applied, the state of the nonvolatile switch changes from a low resistance ON state ($R_{on}$) to a high resistance OFF state ($R_{off}$). Application of a negative write voltage ($-V_w$) results in a transition from a high resistance OFF state ($R_{off}$) to a low resistance ON state ($R_{on}$). The high resistance state ($R_{off}$) of the nonvolatile switch may be used to represent a digital "0" and the low resistance state (Ron) may be used to represent a digital "1". These states remain stable over a desired time period or until a write voltage is applied. Thus, the state of the nonvolatile switch may be used to store digital data. In this example, the nonvolatile switch is described as only having two states. However, the nonvolatile switch is an analog device that can exhibit a wide range of resistances/states.

Figures 3A, 3B:
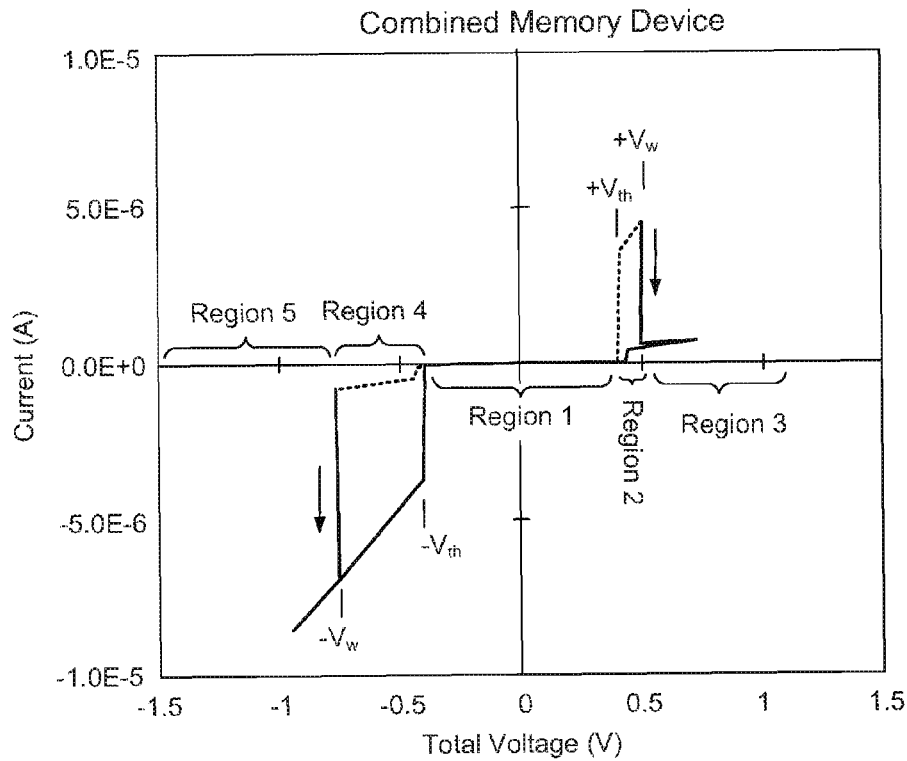
FIG. 3A is a graph of the current/voltage behavior of a combined memory device in a resistive crosspoint memory array, according to one example of principles described herein.
FIG. 3B is a chart showing various operating regions and applied voltages of the combined memory device shown in FIG. 3A, according to one example of principles described herein.

FIG. 3A shows the current/voltage behavior of a combined memory device that includes both the volatile selector switch and a nonvolatile resistive switch. The central portion of the graph (between about −0.4 volts and +0.4 volts in this example) is substantially flat, indicating that for low voltages very little current passes through the combined memory device. This is because at these voltages, the volatile selector switch is in the OFF state. Because the OFF state of the volatile selector switch has an electrical resistance that is at approximately an order of magnitude higher than any other state of the nonvolatile resistive switch or the ON state of the volatile selector switch, this resistance dominates the behavior of the combined memory device and blocks currents for low voltages that are typically seen by half selected and non-selected memory devices in an array. This provides a number of advantages, including blocking of leakage currents (also known as "sneak currents" in cross point arrays) that occur through a combined memory device that is not targeted by a read or write operation but nonetheless has a small voltage applied to it.

In this example, the volatile selector switch turns ON at a threshold of ±0.4 volts ($V_{th}$=±0.4 volts), the write voltage to change the state of the nonvolatile switch to an ON state is 0.5 volts ($+V_w$=0.5 volts), and the write voltage to change the state of the nonvolatile switch to an OFF state is −0.7 volts ($-V_w$=−0.7 volts). These voltage values are used only as examples. Specific combined memory devices may have a range of designs and a variety of different voltage or current thresholds.

Starting at the center of the graph and moving to the right by applying increasingly greater positive voltages across the combined memory device, the first threshold voltage in this example is +0.4 volts. Because the volatile selector switch is in the OFF position and has a much higher resistance than the nonvolatile switch, the majority of this voltage drop occurs across the volatile selector switch. When +0.4 volts across the volatile selector switch is reached or slightly exceeded, the volatile selector switch turns ON and its electrical resistance drops to 1 MΩ. The electrical resistance of the nonvolatile switch, regardless of the state of the nonvolatile switch, now predominates and the majority of the applied voltage is across the nonvolatile switch. If the nonvolatile switch is in the OFF state, it has a resistance of about 1 MΩ and if the nonvolatile switch is in the ON state, it has a resistance of 100 kΩ. Between +0.4 volts and +0.5 volts (the ON switching voltage for the nonvolatile switch) the state of the nonvolatile switch does not change and can be read by applying an intermediate voltage (a read or sense voltage) and sensing the resulting current levels.

Starting at the center of the graph and moving to the left by applying increasingly negative voltages across the memory device, the first threshold voltage ($-V_{th}$) in this example is −0.4 volts where the volatile selector switch changes from its high resistance state to its low resistance state. Between −0.4 volts and −0.7 volts (the OFF switching voltage $-V_w$ for the nonvolatile switch) the state of the nonvolatile switch does not change and can be read by applying an intermediate voltage (a read voltage) and sensing the resulting current levels. For voltages greater than −0.7 volts the nonvolatile switch changes to its OFF state.

The graph in FIG. 3A is divided into five regions that are defined by the switching voltages of the volatile selector switch ($V_{th}$) and the nonvolatile switch ($+V_w$ and $-V_w$). Region 1 is bounded by $\pm V_{th}$, which is at ±0.4 volts in this example. Region 1 is a protected region where the memory combined device conducts minimal current and does not change state. Region 2 is between $+V_{th}$ and $+V_w$. In Region 2, the volatile selector switch is in its low resistance ON state and the resistance behavior of the memory combined device is dominated by the nonvolatile switch. If the nonvolatile switch is ON (shown by the dotted line in Region 2), a significant amount of current flows through the memory device (on the order of 5.0E-6 amps for this example). If the nonvolatile switch is OFF (shown by the solid line in Region 2) only minimal current flows through the memory device. By applying a reading voltage (also called a "sense voltage")

between $+V_{th}$ and $+V_w$, the state of the nonvolatile switch can be read without causing it to change state. Consequently, Region 2 is a readable region.

Region 3 covers voltages that are greater than $+V_w$. In this region, the state of the nonvolatile switch is changed to the OFF state. Consequently, voltages that are greater than $+V_w$ are called writing or programming voltages and Region 3 is a writeable region. Region 4 covers the voltages between $-V_{th}$ and $-V_w$. This region is comparable to Region 2 and is a readable region where the resistance characteristics of the nonvolatile switch dominate the behavior of the memory device. By applying a reading voltage that is more negative than $-V_{th}$ and less negative than $-V_w$, the state of the nonvolatile switch can be determined. Region 4 is wider than Region 2 because the switching behavior of the nonvolatile switch in this example is not symmetric. The $+V_w$ voltage is 0.5 volts but the $-V_w$ voltage is $-0.7$ volts. Thus, Region 4 is a readable region between $-0.4$ and $-0.7$ volts. Region 5 covers voltages that are less than $-V_w$. In this region, the state of the nonvolatile switch is changed to the ON state. Consequently, voltages that are more negative than $-V_w$ are called write voltages and Region 5 is a writeable region.

The chart in FIG. 3B shows operational parameters for one implementation of a combined memory device. In this example, the nonvolatile switch has an OFF resistance ($R_{off}$, FIG. 2B) of approximately 1 M$\Omega$ and an ON resistance ($R_{on}$, FIG. 2B) of approximately 100 k$\Omega$. The volatile selector switch has an OFF resistance ($R_{off}$) of approximately 10 M$\Omega$ and an ON resistance ($R_{on}$, FIG. 2B) of approximately 10 k$\Omega$. Thus, when the volatile selector switch is in the OFF state, its resistance dominates the behavior of the combined memory device because its OFF resistance ($R_{off}$, FIG. 2B) is at least an order of magnitude greater than the OFF or ON resistance of the nonvolatile device. The ON resistance of the volatile selector switch is much lower.

The volatile selector switch is OFF in Region 1 which is defined by the switching voltage threshold ($\pm V_{th}$) of the volatile selector switch. In its OFF state, the switching voltage has a resistance of 10 M$\Omega$. The volatile selector switch is in its ON state in Regions 2, 3, 4, and 5. In these regions, the applied voltage is greater than or less than the switching threshold $V_{th}$. The resistance of the volatile selector switch in these regions is 10 k$\Omega$.

The nonvolatile switch has the characteristics of a memristor, meaning that it retains its state after being programmed until another programming voltage is applied. Thus, while the volatile selector switch responds directly to the applied voltage, the state of the nonvolatile switch changes only when a write voltage is applied (voltages equal to or greater than $+V_w$, $-V_w$). After application of a negative write voltage $-V_w$, the nonvolatile switch remains in the ON state in any of Regions 1, 2, 4, and 5. In this example, the resistance of the nonvolatile switch in its ON state is 100 k$\Omega$. After application of a positive write voltage, $+V_w$, the nonvolatile switch remains in its OFF state in any of Regions 1, 2, 3, 4. The polarities, current values, and voltages are only illustrative examples of one implementation of a combined memory device.

As discussed above, to read the state of the nonvolatile switch, a read voltage is applied. A read voltage can be either positive or negative and falls within one of the reading regions (Region 2 or Region 4). When the memory device is not selected (i.e. the memory array is reading or programming other combined memory devices), the voltage applied across this memory device will fall within the protected region. As discussed above, the resistance of the memory device in the readable regions will be dominated by the resistance of the nonvolatile switch because the volatile selector switch is always in its ON state in the readable regions and the ON state of the volatile selector switch has a resistance that is significantly lower than the resistance of the nonvolatile switch in its ON or OFF states. In the example given above, the resistance of the volatile selector switch in its ON state is 10 k$\Omega$. If the nonvolatile switch is in its OFF state when a reading voltage is applied, the resistance of the memory device will be approximately 1.01 M$\Omega$. If the nonvolatile switch is in its ON state when a reading voltage is applied the resistance of the memory device will be approximately 110 k$\Omega$. Thus in the readable regions, the resistance contributed by the volatile selector switch is minimal and the majority of the voltage drop occurs across the nonvolatile switch. This allows the state of the nonvolatile switch to be unambiguously read.

In the protected region (Region 1), the states of the volatile selector switch and the nonvolatile switch remain unchanged and minimal leakage current passes through the memory device because of its high resistance. The volatile selector switch is OFF in the protected region and has a resistance of 10 M$\Omega$ in this example. If the nonvolatile switch is in its OFF state, the resistance of the combined memory device will be approximately 11 M$\Omega$. If the nonvolatile switch is in its ON state, the resistance of the combined memory device is approximately 10.1 M$\Omega$.

However, as shown in FIG. 3A, at least one of the readable regions (Region 2, Region 4) can be fairly narrow. This is not a significant problem when reading a small array or reading an array that has been carefully prepared so that the behavior of each combined memory device in the array is substantially similar. However, when the memory arrays are produced in a manufacturing environment, there can be significant variation between the various combined memory devices in the same array in or in different arrays that are joined together to form a computer readable memory with a larger capacity. For example, a first combined memory device in a first location of a memory array may have a positive read region (Region 2) that extends from 0.46 volts to 0.55 volts and a second combined memory device may have a positive read region between 0.39 volts and 0.44 volts. In this situation, there is no positive read voltage that can be applied to read both the first and second combined memory devices. The manufacturing tolerances could be tightened to avoid this amount of variation, but this would potentially result in a much higher defect rate and higher cost for producing the memory. Other options include using different reading voltages across the array. However, this could necessitate additional logic and voltage circuitry, greatly increasing the size and complexity of producing an operational memory device.

As discussed above, a third option exists that does not require additional circuitry or higher manufacturing standard. Since the volatile selector switch can be current-controlled NDR device, it can have more than one state at a given voltage when it is voltage-driven. For example, volatile selector shows different current-voltage characteristics (as shown in FIG. 3A) when the voltage is ramped up than when the voltage is ramped down. In FIG. 3A, a voltage bump ($V_{bump}$) can be temporarily applied across the selected combined memory device just prior to reading the state of the combined memory device. The voltage bump is selected so that combination of applied voltage and the duration of the applied voltage rapidly switches the volatile selector switch to its low resistance state, but does not change the state of the nonvolatile switch. The volatile selector switch will maintain its low resistance state as long as current (above a minimum threshold) is flowing through the combined device. After the voltage bump is applied, the read voltage is applied. In one example, there is no significant discontinuity between the application of the voltage bump and the read voltage. Since the conductance of the volatile selector switch is mainly controlled by the temperature, the low resistance state is maintained for a short time until the device is cooled down even after the voltage bump is removed. This maintains the volatile selector switch in its low resistance state even if the read voltage is below the switching threshold $V_{th}$ (i.e. the read voltage may be in the protected Region 1).

Figure 3C:
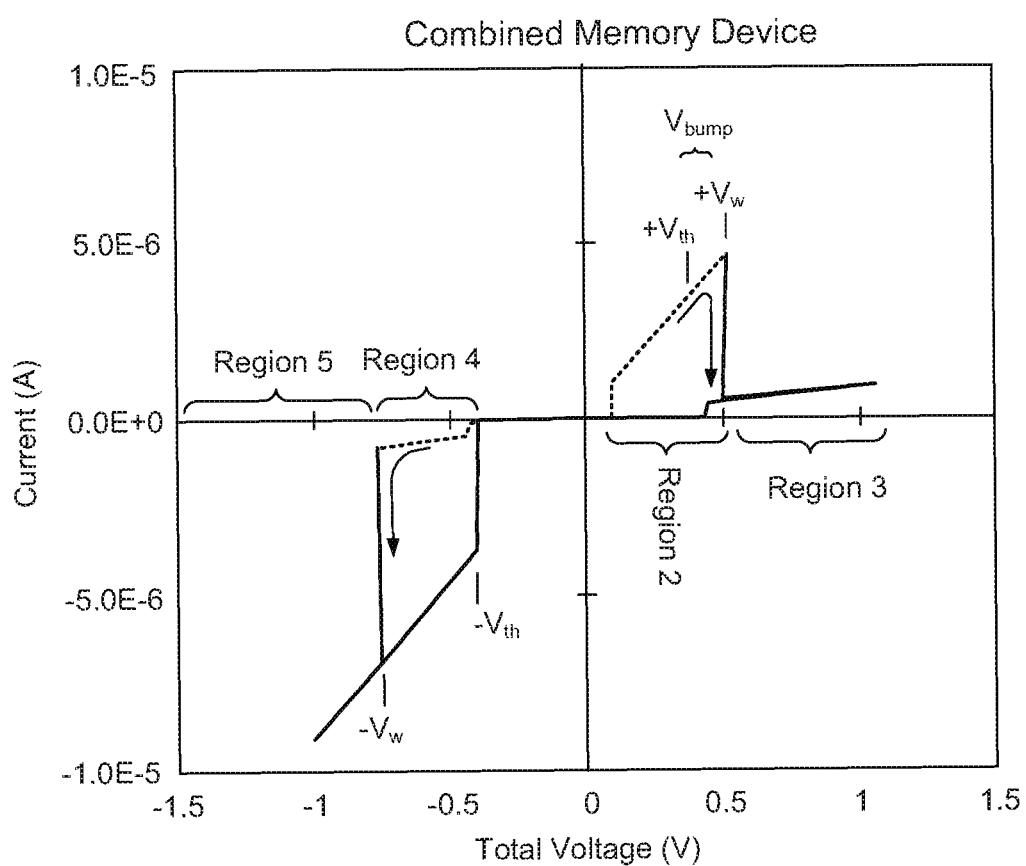
FIG. 3C shows a graph of a current/voltage behavior of a combined memory device after a voltage bump is applied, according to one example of principles described herein.

The voltage applied by the voltage bump may be selected from a relatively wide range of voltages as shown in FIG. 3C. For example, the voltage bump may be selected from a range of voltages that are greater than $V_{th}$ but less than $+V_w$. Alternatively, the voltage bump may be greater than $+V_w$ (the switching threshold for the nonvolatile switch). In this case the duration of the voltage bump is short enough that the state of the nonvolatile switch does not significantly change. The benefit of applying relatively high voltage bumps is that the volatile selector switches will quickly and reliably be changed to their low resistance state. In some examples, even repeated short voltage bumps that are higher than the $+V_w$ threshold will not change the state of the nonvolatile switch. In other examples, the state of the nonvolatile switch may need to be reset after a predetermined number of read operations that include application of a voltage bump greater than $+V_w$.

The broadened reading region (Region 2) is shown in FIG. 3C. This temporary widening of the positive reading region (Region 2) results from the "sticky" switching behavior of the volatile selector switch. As described above, some types of volatile selector switches "stick" in the low resistance state as long as current remains flowing through the combined memory device. Consequently, reading voltages can even be selected that are below the voltage threshold ($V_{th}$) for switching the volatile selector switch to its low resistance state as long as there is no significant interruption in the current flow between the voltage bump and the read voltage. This allows for a single read voltage to be used to read all the combined memory devices in the memory array. For example, the read voltage may be 0.3 volts. This read voltage will be compatible with a first combined memory device and second combined memory device in the example given above. The first combined memory device will have a positive read region (Region 2) that extends from 0.2 volts to 0.55 volts and a second combined memory device may have a positive read region between 0.2 volts and 0.44 volts. A read voltage of 0.3 volts is within the positive read region for both of the devices. Thus, the procedure of applying a voltage bump and then reading the state can be rapidly and reliably used for reading all of the combined memory devices in a memory array. This broadening of the read region resolves the problem of manufacturing variations in threshold voltages between different combined memory devices.

Now returning to FIG. 1, which shows one system that implements the voltage bump technique to broaden the reading voltage range. In this implementation, the combined device X2 is selected to be read. Consequently, the row line connected to X2 is labeled "SR" for selected row and the column connected to X2 is labeled "SC" for selected column. Using a similar nomenclature, the unselected row is labeled "UR" and the unselected column is labeled "UC." In an array with a practical size there would large numbers of unselected rows and columns. For purposes of description, only one unselected row and one unselected column are shown.

In this example, a bias voltage ($V_b$) is applied to the unselected rows UR and the unselected columns UC are allowed to float (at high impedance) as indicated by the label "Float" below the unselected columns. The bias voltage is applied to at least half of the unselected lines. In some examples, the bias voltage may be applied to more or less lines. For example, the bias voltage may be applied to all unselected lines or only to unselected lines that are proximate to the target combined memory device. The bias voltage is used to minimize voltage differences across half selected or unselected combined memory devices, thereby reducing the leakage currents.

As discussed above, the read voltage may be selected from a range of voltages. In one example, the read voltage is equal to half of the write voltage of the nonvolatile switch ($V_b = V_w/2$). The selected row SR is grounded ("GRD") and the selected column SC is connected to the read circuitry (Sense Amp, Vbump selector ON, Vbump selector OFF, and DC voltage source). This completes preparation for the read sequence to start.

The positive and negative voltage bumps are applied to the selected column from the DC voltage sources through small switch transistors (+Vbump Selector ON, +Vbump Selector OFF). Initially, a +Vbump Selector ON switch is closed to connect the Vbump voltage to the selected column. The switch transistor may be pulsed for a very short duration, just long enough to set (or reset) the volatile selector switch. The full Vbump voltage is applied across the combined device X2, which has the other terminal grounded. In one implementation, the Vbump voltage may be above the switching threshold voltage for the volatile selector switch but well below the write voltage for the nonvolatile switch. In other examples, the Vbump voltage may be greater than the write voltage for the nonvolatile switch but have a short enough duration that the state of the nonvolatile switch is not disturbed. This Vbump voltage switches the volatile selector switch in device X2 into its low resistance state in preparation for receiving a lower read voltage. Shortly after the selector switch is activated (turned to its low resistance ON), the voltage applied to the selected column SC is reduced to a lower read voltage that is in the read region (Region 2 in FIG. 3C). The selector will remain ON and the current flow in the selected combined device will be determined by the state and resistance properties of the nonvolatile switch. The read voltage may be selected to minimize leakage currents. For example, the read voltage may be substantially equal to the array bias and one half of the write voltage ($V_{sense} = V_b = V_w/2$). In this case all the unselected rows and the selected column are both biased at a same voltage and the sensing noise can be minimized.

The other combined memory devices that are connected to the selected column SC (in this case only device X4) are not exposed to the complete $V_{bump}$ voltage because one of their terminals is held at the bias voltage $V_b$. Consequently, the half selected devices connected to the selected column SC line do not see a significant enough voltage to switch their volatile selector switches to the low resistance state. Their volatile selector switches remain in the high resistance state.

The unselected combined memory devices that are connected to the selected row SR but not the selected column SC (in this case only device X1) are only exposed to the bias voltage $V_b$. This is also insufficient to change the state of the volatile selector switches in these devices. Consequently, the application of the voltage bump only changes the state of the volatile selector switch in the target device X2. All of the other devices remain in a high resistance state that minimizes leakage currents and allows for unambiguous reading of the state of the selected device X2.

After applying the voltage bump, the current mode sense amp (which is referenced to $V_b$) applies a reading voltage (for example, $V_{sense}=V_b$) to the selected column SC line. Alternatively, the sense amp may be a voltage mode sense amp with Vsense applied to the array. The input to the sense amplifier is a high impedance connected to the selected column SC for both the current or voltage mode sense schemes.

As discussed above, there is no significant discontinuity between the application of the voltage bump and the read voltage. This keeps the volatile selector switch in its low resistance state. The voltage bump selector ON switch is opened and the sense amp detects the current Isense passing through the selected device X2 and through the selected row SR to ground GND. If the nonvolatile switch in X2 is in a high resistance state the sense amp will only detect a small current. If the nonvolatile switch in X2 is in a low resistance state, the sense amp will detect a larger current. The state of the nonvolatile switch in X2 can then be determined by the sense amp, which outputs a voltage Vout that corresponds to the measured state of the device.

After the read operation is complete, the sense amp can be disconnected from the selected column SC and connected to the next column with a target memory device. After the read operation is over, it may be desirable for the volatile selector switch in the device just read (X2) to rapidly return to its high resistance state. This can be accomplished in a number of ways, including simply waiting for the voltage across the selected device X2 and the current through the device X2 to dissipate. Alternatively, the selected row SR may be biased to $V_b$, which will make the voltage across the combined device to zero, and subsequently turn the volatile selector switch OFF.

Alternatively, a $V_{bump}$ selector OFF switch may be used to more rapidly interrupt the current flow. For example, the $V_{bump}$ selector OFF switch may be connected to the selected column SC to ground or to a negative voltage source. This will rapidly drop the voltage on the selected line and stop current flow through the selected device. This can result in more rapid switching of the volatile selector switch in the selected device to its high resistance state. The more quickly the high resistance state of the selected device can be recovered, the quicker the next target device can be read.

Figure 3D:
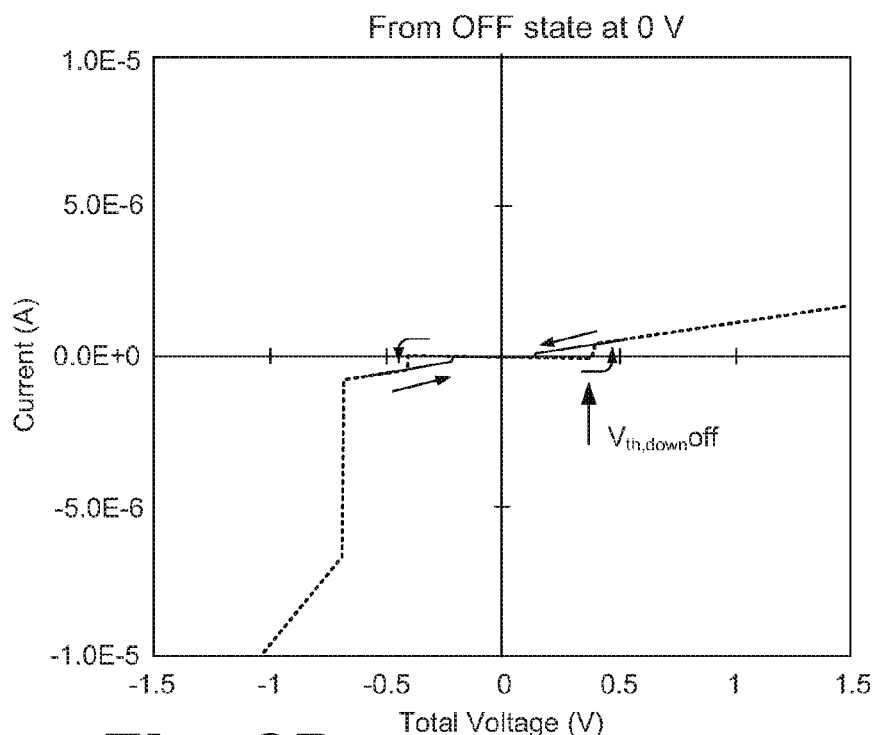
FIGS. 3D-3F show current-voltage curves during operation of a combined device, according to one example of principles described herein.
Figure 3E:
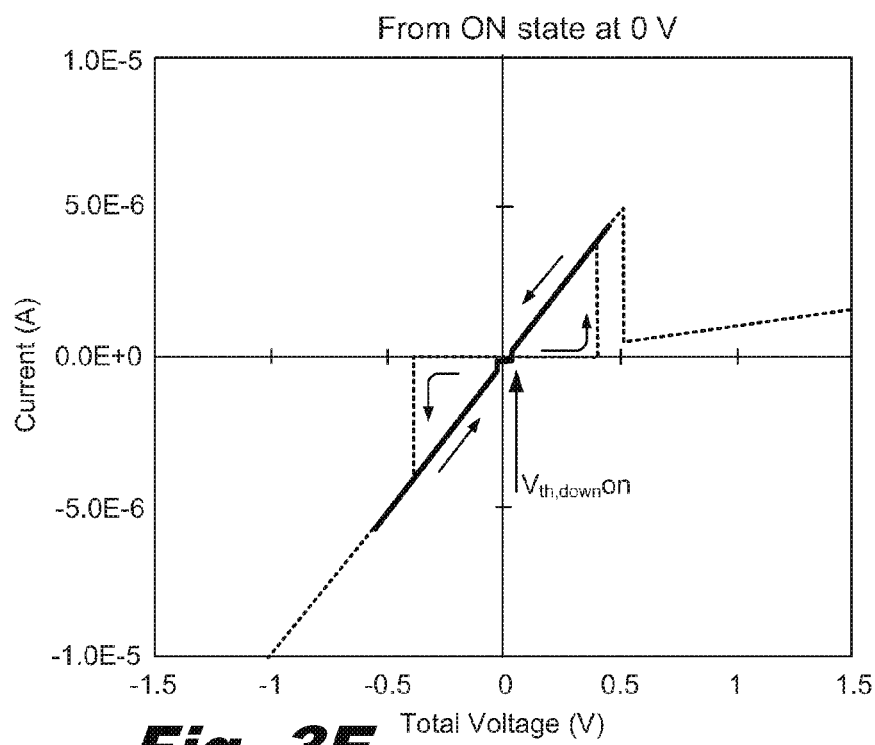

FIG. 3D shows a current voltage curve when the voltage is ramped up and ramped down and the initial state of the nonvolatile switch is OFF. FIG. 3E shows the current-voltage curves when the voltage is ramped up and ramped down when the initial state of the nonvolatile switch is ON. Thus, the current-voltage characteristics are hysteretic when the device is voltage-driven. While it exhibits a higher threshold voltage to turn ON when the voltage is ramped up from 0 V, the ON state is maintained even with a voltage is below the threshold voltage when the voltage is ramped down.

Figure 3F:
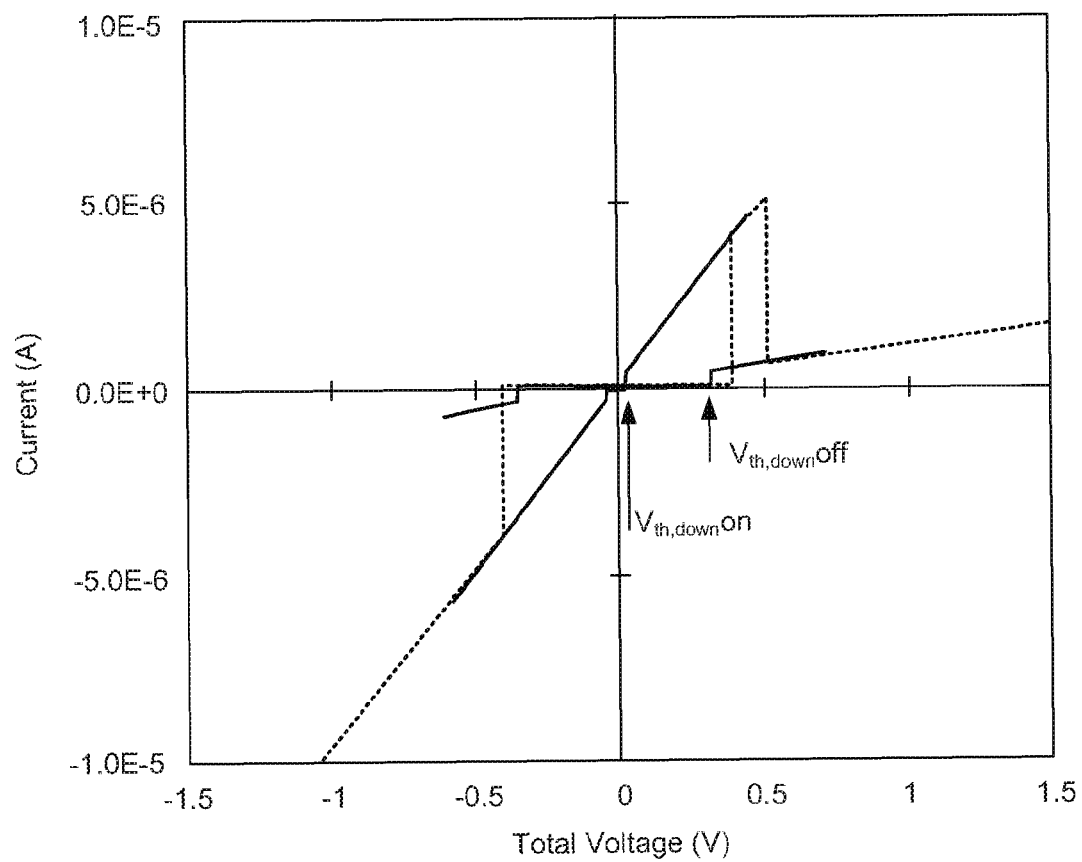

A reset voltage bump may be applied to reset the selected device's selector switch to a high resistance state only if the nonvolatile switch is in its high resistance state and not if it is in the low impedance state. As shown in FIG. 3F the volatile selector switch turns OFF at different combined voltages depending on the resistance state of the nonvolatile switch in a combined device. Since the volatile switch turns off when the current is reduced to below a given threshold current and the current is mainly dictated by the nonvolatile switch once the volatile switch is turned ON, the volatile switch turns OFF at a lower combined voltage when the nonvolatile switch is in its low resistance state (ON) than when it is in its high resistance state (OFF). Therefore, if the reset voltage bump with an amplitude greater than $V_{th,down}^{on}$ but smaller than $V_{th,down}^{off}$, is applied, the volatile selector switch can be turned off only if the nonvolatile switch in the combined device is OFF, but not if it is ON. This can increase the OFF/ON ratio of the combined device and make the measurement of the state of the combined device easier to make and less susceptible to noise.

The OFF/ON resistance ratio after the set voltage bump is applied to turn ON the selector switch equals the high resistance of the nonvolatile switch divided by the low resistance state of the nonvolatile switch. After the reset bump is applied the OFF/ON ration is the $R_{selector\_off}$ resistance divided by the low resistance state of the nonvolatile switch where the $R_{selector\_off}$ resistance is much greater than the high resistance state of the nonvolatile switch.

Ratio after the positive bump=$R_{off}/R_{on}$
Ratio after the negative bump=$R_{selector\_off}/R_{on}$
where $R_{selector\_off} >> R\_{HRS}$ Thus, returning the selector switch to its high resistance state if the nonvolatile switch is in its high resistance state will significantly increase the ability to read the state of the nonvolatile switch due to the much greater resistance difference between the two states. Additionally, the higher resistance (combined high resistances of volatile selector switch and the nonvolatile switch in series) of the combined device can substantially reduce the power dissipation of the device. However, because the reset voltage bump is not required for the fundamental operation of the system, the reset voltage bump and the associated circuit may or may not be present in a given resistive crosspoint memory array.

Figure 4:
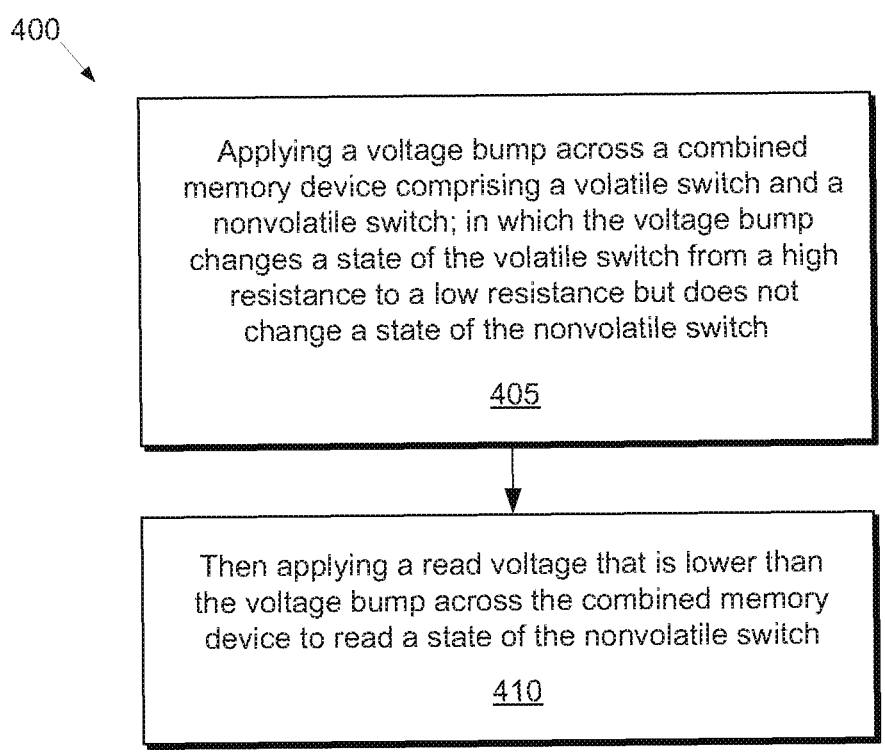
FIG. 4 is a flowchart of one method for using a voltage bump to read a state of a combined memory device, according to one example of principles described herein.

FIG. 4 is a flowchart showing one example of a method (400) for measuring a state of nonvolatile switch in a resistive crosspoint memory array. The method includes applying a voltage bump across a combined memory device comprising a volatile selector switch and a nonvolatile switch. The voltage bump changes a state of the volatile selector switch from a high resistance to a low resistance but does not change a state of the nonvolatile switch (block 405). For example, the voltage bump may be a voltage pulse that exceeds a transition voltage for the volatile selector switch and is less than a write voltage for the nonvolatile switch. In another example, the voltage bump comprises a voltage pulse that exceeds a transition voltage for the volatile selector switch and exceeds the write voltage for the nonvolatile switch but has a duration that is insufficient to change the state of the nonvolatile switch. Where the device is operating in a negative voltage range, the voltage bump may be a negative voltage that is more negative than a negative threshold voltage for the volatile selector switch but less negative than a negative write voltage for the nonvolatile switch.

The voltage bump may be applied across the combined memory device by closing a switch between the combined memory device and a voltage bump source. After application of the voltage bump, a read voltage that is lower than the voltage bump is then applied across the combined memory device to read a state of the nonvolatile switch (block 410). The read voltage may be a lower voltage than a switching voltage threshold for the volatile selector switch. Alternatively, the read voltage may be higher than the threshold voltage for the volatile selector switch but less than a write voltage for the nonvolatile switch. In general, the voltage bump and read voltage are applied such that there is no interruption in the flow of the current through the combined memory device during a transition between the voltage bump and the read voltage. This keeps the volatile selector switch in its low resistance state. The current passing through the combined memory device due to the applied read voltage can be sensed to determine the state of the nonvolatile switch.

In some implementations, the method may also include applying a reset voltage bump to the combined memory device to switch the volatile selector switch back to a high resistance state. The application of a reset voltage bump quickly interrupts and/or reverses the flow of current in the volatile device, allowing it to return to its high resistance state. This can be performed before or after each read operation or applied only if the nonvolatile switch is in a high resistance state. In this situation, the reset voltage bump would not be large enough to cause the volatile device to switch back into its low resistance state.

The techniques and architectures described above may have a number of advantages. Specifically, the principles described above provide for increased read sense and disturb margins. At the beginning of a read operation, a "V_bump" pulse is applied to the selected column SC to activate low resistance state of the volatile selector switch. In some examples, the amplitude of the V_bump pulse is greater than the voltage threshold for the selector switch and less than the write voltage for the nonvolatile switch. After the selector is activated (turned ON), the V_bump pulse is removed and a lower read voltage ($V_{read}$) is applied to the selected column SC as part of the voltage or current mode read schemes. The read disturb margins are improved because V_bump only needs to be large enough to activate the selector and can tolerate a narrower separation between the selector threshold and the write threshold of the nonvolatile switch. The read sense margins are improved because the $V_{read}$ voltage applied to the selected column SC can be made equal to the read array bias applied to the unselected rows UR. This equi-potential sense read scheme can significantly reduce the column half select sense noise. This takes advantage of the switch characteristics of the selector switch to allow the read voltage to be made equal to the array bias. This allows the read operation to be independently optimized with respect to the write operation to achieve the optimal read margins. In one example, the read voltage and bias voltage can be reduced to approximately one half of the write voltage.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A method comprising:
   applying a voltage bump across a combined memory device comprising a volatile selector switch and a nonvolatile switch; in which the voltage bump changes a state of the volatile selector switch from a high resistance to a low resistance but does not change a state of the nonvolatile switch; and
   then applying a read voltage that is lower than the voltage bump across the combined memory device to read the state of the nonvolatile switch.

2. The method of claim 1, in which the voltage bump comprises a voltage pulse that exceeds a switching threshold voltage for the volatile selector switch but is less than a combined write threshold voltage for the nonvolatile switch.

3. The method of claim 1, in which the voltage bump comprises a voltage pulse that exceeds a threshold voltage for the volatile selector switch and exceeds a write threshold voltage for the nonvolatile switch but has a duration that is insufficient to change the state of the nonvolatile switch.

4. The method of claim 1, in which the voltage bump is a negative voltage that is more negative than a negative read voltage and less negative than a negative combined write voltage for the nonvolatile switch.

5. The method of claim 1, in which applying the voltage bump across the combined memory device comprises closing a switch between the combined memory device and a voltage bump source.

6. The method of claim 1, wherein the read voltage comprises a lower voltage than a switching voltage threshold for the volatile selector switch.

7. The method of claim 1, further comprising applying a reset voltage bump to the combined memory device to switch the volatile selector switch back to a high resistance state.

8. The method of claim 1, in which the voltage bump and the read voltage are applied such that there is no interruption in a flow of current through the combined memory device during a transition between the voltage bump and the read voltage.

9. The method of claim 1, further comprising applying a bias voltage to unselected lines in a resistive crosspoint memory array comprising the combined memory device.

10. A method for resistive crosspoint memory array sensing comprising:
    applying a bias voltage to unselected lines in the resistive crosspoint memory array comprising a combined memory device comprising a volatile selector switch and a nonvolatile switch;
    applying a voltage bump across the combined memory device; in which the voltage bump changes a state of the volatile selector switch from a high resistance to a low resistance but does not change a state of the nonvolatile switch; and
    then applying a read voltage lower than the voltage bump across the combined memory device such that a current proportional to the state of the nonvolatile switch passes through the combined memory device;
    in which the read voltage is applied to a selected row or a selected column connected to the combined memory device, in which the read voltage is equal to the bias voltage.

11. A system comprising:
    a resistive crosspoint memory array comprising combined memory devices, the combined memory devices comprising a volatile selector switch and a nonvolatile switch;
    a voltage bump source;
    a voltage bump selector switch connected between the voltage bump source and the resistive crosspoint memory array;
    a sense amplifier supplying a read voltage;
    in which the voltage bump source is connected to the resistive crosspoint memory array by closing the voltage bump selector switch such that the combined memory device in the resistive crosspoint memory array is exposed to a voltage bump to switch the volatile selector switch in the combined memory device to a low resistance state prior to applying the sensing voltage across a selected combined memory device.

12. The system of claim 11, in which the voltage bump comprises a voltage greater than a switching threshold for the volatile selector switch but less than a combined switching threshold for the nonvolatile switch.

13. The system of claim 11, further comprising a reset voltage bump selector switch connected between a reset voltage bump source and the resistive crosspoint memory array.

14. The system of claim 11, further comprising a bias voltage source connected to unselected lines in the resistive crosspoint memory array, in which the bias voltage source applies a bias voltage to at least half of the unselected lines.

15. The system of claim 14, in which the bias voltage is one half of a combined write threshold voltage for the nonvolatile switch.

* * * * *